(12) United States Patent
Yokogawa et al.

(10) Patent No.: US 10,665,448 B2
(45) Date of Patent: May 26, 2020

(54) PLASMA PROCESSING APPARATUS

(71) Applicant: HITACHI HIGH-TECHNOLOGIES CORPORATION, Tokyo (JP)

(72) Inventors: Ken'etsu Yokogawa, Tokyo (JP); Masahito Mori, Tokyo (JP); Takao Arase, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 249 days.

(21) Appl. No.: 13/953,924

(22) Filed: Jul. 30, 2013

(65) Prior Publication Data

US 2014/0102640 A1    Apr. 17, 2014

(30) Foreign Application Priority Data

Oct. 17, 2012   (JP) ................................ 2012-229710

(51) Int. Cl.
   *H01L 21/00*      (2006.01)
   *C23C 16/00*      (2006.01)
   (Continued)

(52) U.S. Cl.
   CPC .... *H01L 21/02002* (2013.01); *H01J 37/3244* (2013.01); *H01J 37/32449* (2013.01)

(58) Field of Classification Search
   CPC ............ H01J 37/3244; H01J 37/32449; C23C 16/45565
   See application file for complete search history.

(56) References Cited

U.S. PATENT DOCUMENTS 5,074,456 A * 12/1991 Degner ............. H01J 37/32009
                                               156/345.34
5,595,606 A    1/1997 Fujikawa et al.
(Continued)

FOREIGN PATENT DOCUMENTS

JP    2006-287162 A    10/2006
JP    2006-344766 A    12/2006
(Continued)

OTHER PUBLICATIONS

Korean Office Action received in corresponding Korean Application No. 2013-0093351 dated Jul. 28, 2014.
(Continued)

*Primary Examiner* — Sylvia MacArthur
*Assistant Examiner* — Michelle Crowell
(74) *Attorney, Agent, or Firm* — Mattingly & Malur, PC

(57) ABSTRACT

A plasma processing apparatus having a stable plasma generation under wide-ranging process conditions, and superior in uniformity and reproducibility, comprises an upper electrode 3 having gas supply through holes 6, a gas supply means and a lower electrode 1, wherein the gas supply means includes a plane-like member 4 having gas through holes 8 and a plane-like member 5 having gas through holes 10, and the gas supply through holes 6 and the gas through holes 8 are connected through a groove 7, and the gas through holes 8 and the gas through holes 10 are connected through a groove 9, and wherein the gas supply through holes 6, the gas through holes 8 and the gas through holes 10 are disposed at positions, different from each other on a plane.

17 Claims, 5 Drawing Sheets

(51) Int. Cl.
*H01L 21/02* (2006.01)
*H01J 37/32* (2006.01)

(56) References Cited

U.S. PATENT DOCUMENTS

| | | | | |
|---|---|---|---|---|
| 5,950,925 | A * | 9/1999 | Fukunaga | C23C 16/45512 118/715 |
| 6,110,556 | A * | 8/2000 | Bang | C23C 16/455 118/715 |
| 6,173,673 | B1 * | 1/2001 | Golovato | H01L 21/67069 118/723 E |
| 6,475,563 | B2 * | 11/2002 | Hayakawa | C23C 16/20 118/715 |
| 6,872,258 | B2 * | 3/2005 | Park | C23C 16/45565 118/715 |
| 7,481,886 | B2 * | 1/2009 | Kato | C23C 16/455 118/715 |
| 8,366,828 | B2 * | 2/2013 | Iizuka | C23C 16/4412 118/715 |
| 8,845,855 | B2 * | 9/2014 | Hubacek | H01J 37/32009 118/715 |
| 2001/0002582 | A1 * | 6/2001 | Dunham | C23C 16/45565 118/715 |
| 2005/0039681 | A1 * | 2/2005 | Fukiage | C23C 16/4411 118/723 E |
| 2006/0288934 | A1 * | 12/2006 | Takahashi | C23F 4/00 118/715 |
| 2009/0130335 | A1 | 5/2009 | Okumura et al. | |
| 2009/0208650 | A1 * | 8/2009 | Narushima | C23C 16/14 427/250 |
| 2010/0163187 | A1 * | 7/2010 | Yokogawa | H01J 37/32091 156/345.34 |
| 2010/0319854 | A1 | 12/2010 | Yokogawa et al. | |
| 2011/0180213 | A1 * | 7/2011 | Hirayama | H01J 37/32192 156/345.33 |
| 2011/0290419 | A1 * | 12/2011 | Horiguchi | H01J 37/3244 156/345.29 |
| 2013/0189432 | A1 * | 7/2013 | Nakashima | C01B 31/0226 427/249.1 |
| 2014/0165912 | A1 * | 6/2014 | Kao | C23C 16/455 118/723 R |
| 2015/0069674 | A1 | 3/2015 | Okesaku et al. | |

FOREIGN PATENT DOCUMENTS

| | | |
|---|---|---|
| JP | 2007-5491 A | 1/2007 |
| JP | 2008-108796 A | 5/2008 |
| JP | 2010-263049 A | 11/2010 |
| JP | 2011-9249 A | 1/2011 |
| JP | 2012-28273 A | 2/2012 |
| KR | 10-0224461 B1 | 10/1999 |
| KR | 10-1109069 B1 | 1/2012 |
| WO | 2007/026889 A1 | 3/2007 |

OTHER PUBLICATIONS

Japanese Office Action received in corresponding Japanese Application No. 2012-229710 dated Mar. 29, 2016.
Japanese Office Action received in corresponding Japanese Application No. 2012-229710 dated Nov. 1, 2016.
Japanese Office Action received in corresponding Japanese Application No. 2017-015281 dated Nov. 14, 2017.

* cited by examiner

PLASMA PROCESSING APPARATUS

CLAIM OF PRIORITY

The present application claims priority from Japanese Patent Application No. JP 2012-229710 filed on Oct. 17, 2012 the content of which is hereby incorporated by reference into this application.

FIELD OF THE INVENTION

The present invention relates to a plasma processing apparatus.

BACKGROUND OF THE INVENTION

A plasma processing, such as, a dry etching, representatively, is a process for conducting micro-processing on a semiconductor, so as to obtain a desired configuration thereof, through etching of parts other than mask portions on a surface of a sample to be processed, while exposing the sample to be processed to a gas, being brought into plasma through electromagnetic waves, which is introduced into a vacuum container having a vacuum exhaust means. Upon uniformity of processing within a sample surface to be processed, the followings have ill influences; i.e., distribution of plasma, distribution of temperature within the sample surface to be processed, and/or distribution of composition of a gas supplied and a flow rate thereof, etc. In particular, in such plasma processing apparatus of parallel plate type, as is disclosed in the following Japanese Patent Laid-Open No. 2011-9249, since the gas is supplied from a shower plate, on which a large number of fine gas through holes are formed, to be disposed opposing to the sample to be processed, and the distance between the sample to be processed and the shower plate is relatively short, the distribution of supply of the gas, which is supplied from the shower plate gives an ill influence upon a processing rate and/or an etching profile, etc. The plasma processing apparatus of the parallel plate type, practically utilizing this characteristic, has an advantage of enabling to control the distribution of the processing rate and/or the shape within the sample surface to be processed, and thereby obtaining a uniformity desired.

However, in the plasma processing apparatus of parallel plate type, a strong radio-frequency electric field, for forming plasma, lies in the vicinity of the shower plate, and because of this electric field, there are sometimes produced cases where electric discharge is generated within gas through holes, which are formed on the shower plate. The electric discharge within the gas through hole produces generation of a particle and/or contamination, from a conductive material, etc., which is disposed on a rear surface of the shower plate. This also gives an ill influence on the etching profile at the position of the sample surface to be processed, corresponding to the position where the electric discharge is generated within the gas through hole, i.e., to be a cause of reason of defects. Further, generation of the electric discharge within the gas through hole increases an amount of ablation of the shower plate through hole, then brings about a problem of shortening a cycle of exchanging the shower plate and increasing a manufacturing cost, etc.

For dealing with such the problem as was mentioned above, normally, it can be considered to make a diameter of the gas through hole to be formed or treated on the shower plate, as small as possible. For example, applying the gas through hole of 0.1 mm to 0.5 mm, so as to heighten a probability of annihilation of an electron on a side wall of the through hole, it is possible to reduce a risk of the electric discharge within the gas through hole. However, only with such small-sizing of the diameter of the gas through hole, substantially, it is impossible to prevent the electric discharge from being generated within the gas through hole, but rather this rather results into a restriction of condition for electric discharge (i.e., restrictions of electric power for electric discharge and/or the flow rate of a supply gas, etc.) Also, the small-sizing of the gas through hole brings up a processing cost of the shower plate to be expensive, i.e., a cause of reason of increasing the cost. Moreover, normally, for the purpose of discharging the gas, uniformly, there is a necessity of bringing the positions of the gas through holes, which are treated on a conductor portion to be located on a rear surface of the shower plate, to be coincide with the positions of the gas through holes to be treated on the shower plate; however, if the diameter of the gas through hole is small, it is difficult to bring them to be coincide with, from a viewpoint of accuracy, and then there are brought about cases where a uniformity of gas supply on a surface goes down and/or a reproducibility of gas supply cannot be obtained.

In the Japanese Patent Laid-Open No. 2011-9249 is also disclosed a plasma processing apparatus, for suppressing an abnormal electric discharge to be produced within the gas through holes of the shower plate, wherein an upper electrode is made of a shower plate, on which first gas through holes are treated with, a conductor plate, on which second gas through hole are treated with, to be disposed on a rear surface of the conductor plate, an insulator plate, on which third gas through holes are treated with, to be located at a central portion of the conductor plate, and an antenna substrate portion having a temperature controlling function and a gas distribution portion, to be disposed in the rear surface of the conductor plate, and a first very small gap is defined in a radial direction on a boundary surface between the shower plate and the insulator plate, a second very small gaps is defined in the radial direction on a boundary surface between the insulator plate and the conductor plate, and centers of the first gas through holes are shifted from those of the third gas through holes, in a peripheral direction or the radial direction.

However, with this apparatus, it is possible to suppress the abnormal electric discharge at the central portion of the conductor plate; however, no consideration is paid on suppression of the abnormal electric discharge in portions other than the central portion. Also, the first gas through holes and the third gas through holes mentioned are shifted from, but no consideration is paid, fully, on shortage of conductance of a gas flow due to shifting between those first gas through holes and the third gas through holes.

As a result of the above, with such conventional structure of the shower plate, there can be considered cases where a processing capacity or performance with applying the plasma cannot be taken out, due to restriction of the etching condition, lowering of the uniformity, and further lowering of the reproducibility thereof.

SUMMARY OF THE INVENTION

The present invention is made for accomplishing a plasma processing apparatus, for achieving the uniformity and the reproducibility of gas supply in the plasma processing apparatus, and having a gas supply means for enabling a great easing of the condition of electric discharge (i.e., the restrictions of electric power of electric discharge and/or the flow rate of a supply gas), which is restricted by the generation of the abnormal electric discharge in the gas supply means portion, as well as, the particles and the contamination accompanying therewith; and, an object of the present invention is to provide a plasma processing apparatus for enabling a stable plasma generation in a wide process condition, having processing capacity superior in the uniformity and the reproducibility thereof, even with the plasma processing apparatus of the parallel plate type.

As one embodiment for accomplishing the object mentioned above, there is provided a plasma processing apparatus, comprising: a processing chamber, which is configured to process a sample with using plasma therein; a first electrode, which is configured to be supplied with radio-frequency electric power for procuring the plasma; a gas supply means, which is configured to supply a gas for generating the plasma into the processing chamber, and is disposed to be adjacent to the first electrode; a second electrode, which is disposed to oppose to the first electrode via the gas supply means; and a exhaust means, which is configured to make vacuum exhaust on the processing chamber, wherein the first electrode has a gas supply portion, which is configured to supply the gas to the gas supply means, the gas supply means has a first gas supply plate and a second gas supply plate, on the first gas supply plate are formed first gas through holes, into which the gas supplied from gas through holes of the gas supply portion is supplied through a groove-like first flow passage, on the second gas supply plate are formed second gas through holes, into which the gas supplied from the first gas through holes is supplied through a groove-like second flow passage, the first flow passage is formed on either the gas supply portion or the first gas supply plate, the second flow passage is formed on either the first gas supply plate or the second gas supply plate, the gas through holes of the gas supply portion are formed in such a manner that images of the gas through holes of the gas supply portion, projected on the first gas supply plate, fall within an image of the first flow passage projected on the first gas supply plate, the first gas through holes are formed in such a manner that images of the first gas through holes on the second gas supply plate, projected on the second gas supply plate, fall within an image of the second flow passage projected on the second gas supply plate, and the second gas through holes supply the gas supplied from the first gas through holes through the second flow passage into the processing chamber.

Also, there is provided a plasma processing apparatus, comprising, a parallel plate electrode, constructed with an upper electrode having first gas through holes and a lower electrode for mounting a sample thereon, which is configured to generate plasma between the upper electrode and the lower electrode; and a gas supply means, disposed adjacent to a lower side of the upper electrode, which is configured to supply a gas from a gas supply portion to the lower electrode for generating the plasma, wherein the gas supply means is a plane-like member having a first groove-like flow passage, which is provided on a side facing to the upper electrode, a second gas through hole provided within the first groove-like flow passage, a third gas through hole provided on a side facing to the upper electrode, and a second groove-like flow passage for connecting the second gas through hole and the third gas through hole in an inside there, and the first gas through hole and the second gas through hole are connected through the first groove-like flow passage, and the first gas through hole, the second gas through hole and the third gas through hole are disposed at positions, respectively, differing from each other on a plane.

According to the present invention, it is possible to provide a plasma processing apparatus for enabling a stable plasma generation in wide-ranging process conditions, having processing capacity superior in the uniformity and the reproducibility thereof, even with the plasma processing apparatus of the parallel plate type.

BRIEF DESCRIPTION OF THE DRAWINGS

Those and other objects, features and advantages of the present invention will become more readily apparent from the following detailed description when taken in conjunction with the accompanying drawings wherein.

DETAILED DESCRIPTION OF THE PREFERRED EMBODIMENTS

An embodiment of the present invention is characterized in that a plane-like gas supply means is provided on an upper electrode, which is disposed at a position facing to a sample to be processed, and the gas supply means is constructed with two layers of members having the same diameter, wherein a plural number of gas through holes are formed on each one of the members of the layers, respectively, and further a fluid connection is made between gas through holes of each layer through groove-like gas connecting structures, which are formed in a plane direction. With this, it is possible to dispose the gas through holes to be formed on the material of each layer, not in coincident with each other on a plane.

According to the present invention, it is possible to achieve a uniform and stable gas supply, with preferable reproducibility, on a surface of the sample to be processed, and further to ease the condition of electric discharge, which is restricted by the abnormal electric discharge generating in a gas supply means portion, and therefore, it is possible to provide a plasma processing apparatus for enabling processing under wide-ranging process conditions.

Hereinafter, explanation will be made on the present invention, by referring to embodiments.

First Embodiment

Figure 1:
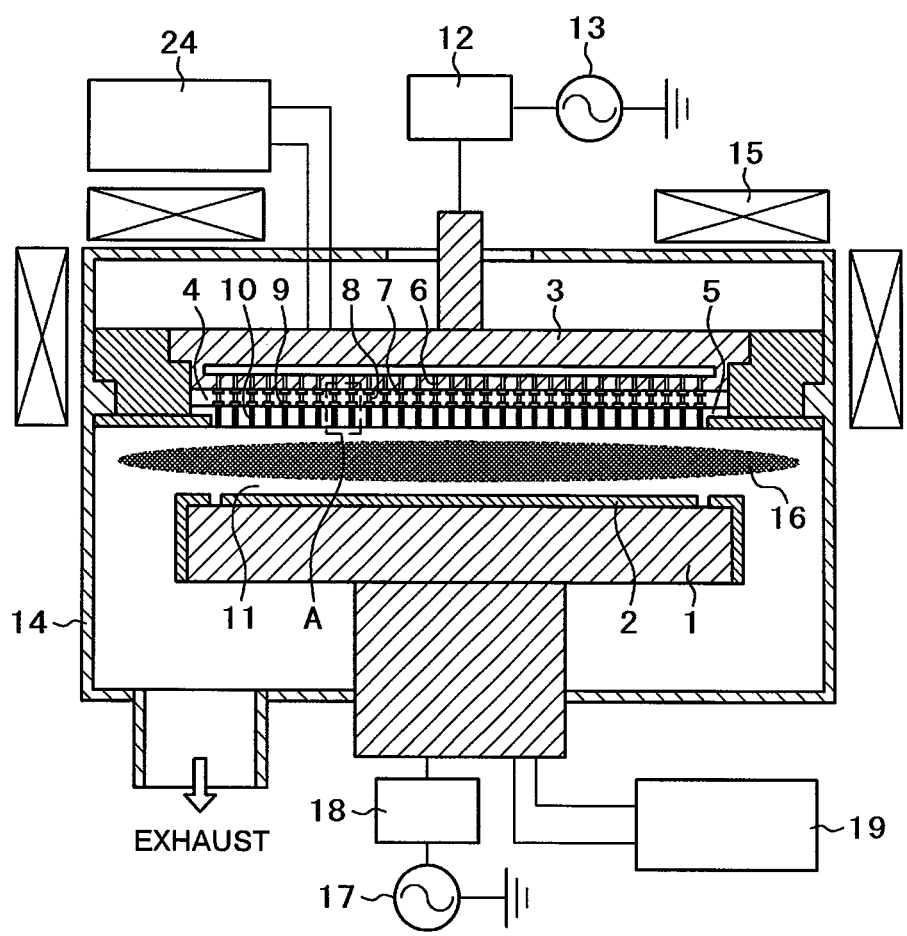
FIG. 1 is a cross-section view for showing a basic configuration of a plasma processing apparatus, according to a first embodiment of the present invention.

An embodiment 1 of the present invention will be explained by referring to FIG. 1. This FIG. 1 shows a cross-section view of the basic configuration of a plasma processing apparatus according to the present embodiment. First of all, explanation will be given on the structure of the apparatus shown in FIG. 1. This FIG. 1 shows the plasma processing apparatus of parallel plate type, and there are disposed an upper electrode 3 to be located at a position facing to a sample 2 to be processed (i.e., a wafer), which will be disposed on a means, for setting up the sample to be processed thereon (i.e., a sample stage) 1, and a first plane-like member 4 and a second plane-like member 5, both having the same diameter, are disposed on a side of the upper electrode 3, facing to the sample to be processed, as a gas supply means. Gas supply onto the first plane-like member 4 and the second plane-like member 5 is made from a gas supply portion 6, which is formed on the upper electrode 3, normally made of aluminum or stainless. However, for those first and second plane-like members, it is not necessary to be same in the diameter thereof, but is practical if they are same in the diameter thereof.

Figure 2:
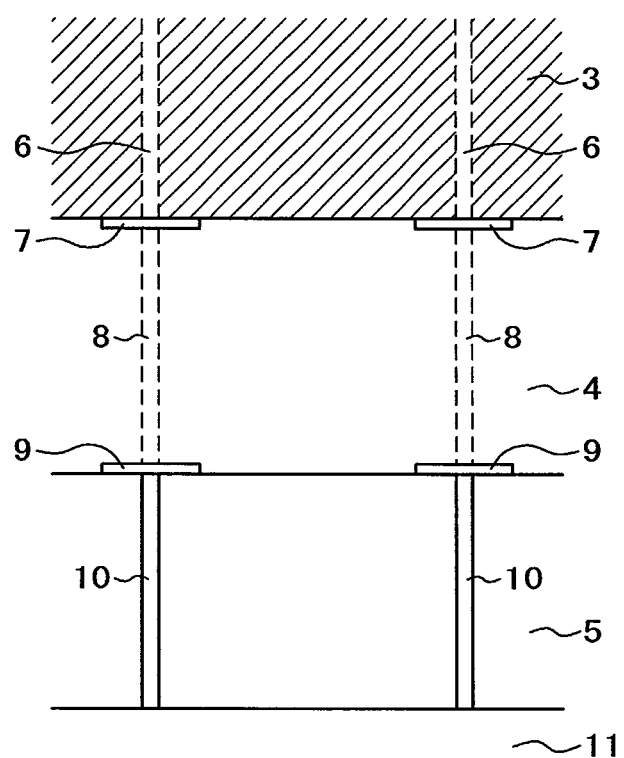
FIG. 2 is a cross-section view for showing an outline structure of a gas supplying means portion, which is shown by "B" in FIG. 1.
Figure 3:
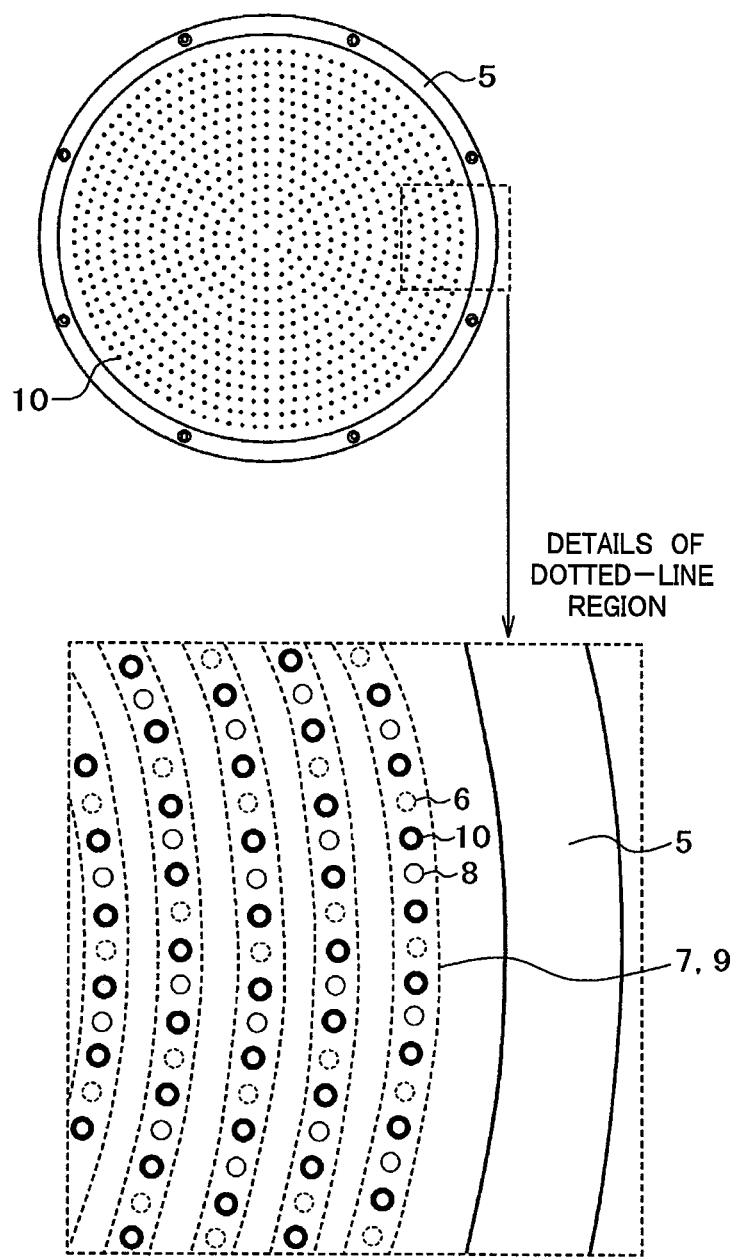
FIG. 3 is a plane views for showing an outline structure of the gas supply means portion, seen from a lower side (a lower electrode side), in the plasma processing apparatus shown in FIG. 1, in particular, for showing an entire thereof in an upper side while a partial enlarged view thereof in a lower side, respectively.

Next, explanation will be given on the gas supply means portion by referring to FIGS. 2 and 3. FIG. 2 is a cross-section view for showing an outlook structure of the gas supply means portion in the plasma processing apparatus shown in FIG. 1, and FIG. 3 is a plane view of the outlook structure thereof, i.e., the details of the gas supply portion (through hole) 6 of upper electrode 3, and portions of the first plane-like member 4 and the second plane-like member 5. FIG. 2 is a detailed view of a portion "A" shown by broken lines in FIG. 1, and there are shown the cross-section views of the gas supply portion 6 of the upper electrode 3, and a gas through hole 8 of the first plane-like member 4 and a gas through hole 10 of the second plane-like member 5. However, the gas through hole 6 is disposed shifting from the gas through holes 8 and 10 on a plane, and the gas through holes 6 and 8 are connected through a first groove 7, and the gas through holes 8 and 10 are connected through a second groove 9, respectively. Explanation will be given on this structure by referring to FIG. 3.

FIG. 3 is a plane view, when seeing the second plane-like member 5 from a side of the sample 2 to be processed. A gas of the plasma is guided into the gas through hole 8 of the first plane-like member 4, from the gas supply portion 6, which is formed on the upper electrode 3 made of a conductor body, through the first groove 7, which is formed in a peripheral direction. Also, the gas passing through the gas through hole 8 of the first plane-like member 4 is guided into the gas through hole 10 of the second plane-like member, through the second groove 9, which is formed in the peripheral direction so that it is put on the first groove on a plane view, and finally, it is introduced into an electric discharge space 11, in the structure thereof. As is shown in FIG. 3, the gas supply portion 6 (i.e., the gas through hole shown by a dotted line in FIG. 3), which is formed on the upper electrode 3, and the gas through hole 8 (i.e., the gas through hole shown by a thin solid line in FIG. 3) of the first plane-like member 4 are formed at the places, respectively, not coincident with on a plane view, in the structures thereof. Similarly, the gas through hole 8 (i.e., the gas through hole shown by the thin solid line in FIG. 3) of the first plane-like member 4 and the gas through hole 10 (i.e., the gas through hole shown by a thick solid line in FIG. 3) of the second plane-like member 5 are also formed, respectively, at the positions not coincident with on the plane view, in the structures thereof. However, it is not necessary to form the first groove and the second groove in such a manner that they are put on each other on the plane view; however, forming them to be put on each other enables such a simple structure that can be manufactured, easily.

In the present embodiment, quartz is applied for the first plane-like member 4 and also for the second plane-like member 5. Also, the first groove 7 and the second groove 9 shown in FIG. 2 are formed on both surfaces of the first plane-like member, respectively. However, there is no necessity of building up the gas supply means with two pieces of the plane-like members, always; but such two piece structure is practical from a viewpoint, since those the grooves can be formed, easily. Also, for the first groove 7 and the second groove 9, there is no necessity to be provided on the first plane-like member 4, but they may be formed on the upper electrode or the second plane-like member, and it is practical to provide them on the both surfaces of the first plane-like member 4, since they can be processed, easily. A diameter of the gas through hole 8 of the first plane-like member 4 and the gas through hole 10 of the second plane-like member 5, which are shown in FIGS. 1, 2 and 3, is determined to be 0.4 to 0.5 mm. Thickness of each plane-like member is determined to be 15 mm. Also, the first groove 7 and the second groove, which are shown in FIG. 2, are determined to be 3 mm in groove width (i.e., a spatial width in the plane direction) and 0.3 mm in groove height thereof. Also, in the present embodiment, the gas through hole 10 of the second plane-like member 5, the gas through hole 8 of the first plane-like member 4, and the gas supply portion 6, which is formed on the upper electrode 3, are disposed in a concentric manner, and a number of the gas through holes 8 of the first plane-like member 4 and the gas through holes of the gas supply portion 6 formed on the upper electrode 3 is determined to be a half (½), comparing to the number of the gas through holes 10 of the second plane-like member 5. In more details thereof, the number of the gas through holes 10 of the second plane-like member 5 is 750 pieces, and the number of the gas through holes 8 of the first plane-like member 4 and the gas through holes of the gas supply portion 6 formed on the upper electrode 3 is 375 pieces, respectively. Also, in the configuration of the apparatus of the embodiment shown in FIG. 1, a radio-frequency electric power from a radio-frequency power supply 13 is supplied to the upper electrode 3, through a matching box 12, wherein plasma 16 is generated within the electric discharge space 11, due to a mutual interaction between that radio-frequency electric power and magnetic force produced by means of a solenoid coil 15, which is disposed in an outside of a vacuum container 14. With the sample setup means 1, on which the sample to be processed is set up or mounted, is connected with a radio-frequency power supply 17, other than that for use of plasma generation, through a matching box 18. The radio-frequency electric power from the radio-frequency power supply 17 has a function of accelerating ions among from the plasma 16, so as to irradiate or hit upon the sample 2 to be processed. Also, with the sample setup means 1 is connected a cooling means 19, which has a function of adjusting temperature of the sample 2 to be processed. In the embodiment shown in FIG. 1, the frequency of the radio-frequency electric power to be supplied to the upper electrode 3 is determined to be 200 MHz, and the frequency of the radio-frequency electric power to be supplied to the sample setup means 1 is to be 4

MHz, respectively. Further, a reference numeral 24 denotes an upper electrode temperature controlling means.

Figure 4:
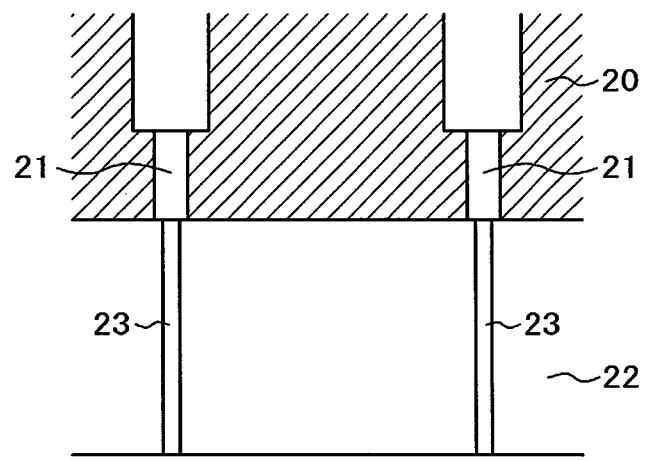
FIG. 4 is a cross-section view for showing an outlook structure of an essential portion (i.e., a shower plate and an upper electrode) for explaining a problem in the conventional plasma processing apparatus.

Next, explanation will be given on the problem to be dissolved according to the present invention, in the conventional apparatus, by referring to FIG. 4. This FIG. 4 is a cross-section view of a general structure for gas supply, which is implemented on the upper electrode of the apparatus of the parallel plate type, and in particular, it shows an enlarged view of peripheries of a gas through hole portion. Normally, a plural number of gas through holes shown in FIG. 4 are disposed on a plane. In the conventional apparatus shown in FIG. 4, a gas through hole 23 of a shower plate 22 is formed at the position same to that of a gas supply portion 21, which is formed on an upper electrode 20 made of a conductive body.

For conducting a stable supply of gas in the electric discharge space with such the structure as shown in FIG. 4, it is necessary to dispose the gas supply portion 21, which is formed on the upper electrode 20, and also the gas through hole 23 of the shower plate 22, to be in coincident with. In this instance, if the size of the gas supply portion formed on the upper electrode 20 is as much as that of the gas through hole 23 of the shower plate 22, in the degree thereof, then there may be possibility of generating a difference in an amount of supply of the gas from each through hole, due to shift of the position of the through hole, or a change of condition of attachment thereof, for each through hole; i.e., it is impossible to obtain a uniformity and/or a reproducibility of the gas supply. Also, due to thermal expansion accompanying with an increase of temperature, etc., during the use thereof, the gas through hole 23 of the shower plate 22 and the gas supply portion 21, which is formed on the upper electrode 20, are changed in the relative positions thereof, and there may be generated a case where the condition of the gas supply is changed time-sequentially. Because the shower plate 22 is an interchangeable part, normally, it must be detachable from the upper electrode 20, and then high attachment accuracy is required so that the gas through holes are always in coincide with, certainly, every time when it is attached.

However, since it is difficult to keep the gas through holes to be in coincident with, with certainty, only upon basis of the accuracy thereof, then as is shown in FIG. 4, the size of the gas supply portion 21 implemented on the upper electrode 20 is made large, comparing to the diameter of the gas through hole of the shower plate 22, and thereby preventing the gas through holes themselves from being shifted from, completely, even if they are shifted a little bit. However, with such structure, it is necessary to enlarge the diameter, considerably, of the through hole of the gas supply portion 21, which is implemented on the upper electrode 20, and this increases a risk to be large, of generating the abnormal electric discharge within the through hole of that gas supply portion 21. In particular, with such structure as shown in FIG. 4, since active particles, such as, electrons, etc., invade into the through hole of the gas supply portion, directly, from the plasma, then mixing of the active particles triggering the electric discharge is also added, in addition to the size of the space, therefore, there is generated a condition that the abnormal electric discharge can be generated easily, much more. Accordingly, for the purpose of preventing the abnormal electric discharge, it is necessary to limit the radio-frequency electric power to be applied on the upper electrode 20 and/or an amount of the gas flow to be supplied from the gas supply portion 21; i.e., this results to impose a restriction(s) on a process capacity.

Also, with the structure shown in FIG. 4, the surface of the upper electrode 20, normally, made of the conductive body, is disposed at such a portion that it can be seen from the plasma, directly, through the gas through holes 23 of the shower plate 22. As was mentioned previously, because of the invasion of the active particles, such as, the electrons, etc., from among the plasma, from the gas through holes of the shower plate 22, this affects an ill influence upon the surface of the upper electrode, being the conductor body, and therefore, there may be also cases of generating metal contamination and/or particles. Although it is possible to take a countermeasure, such as, coating the surface of the upper electrode 20 with a stable material, and so on, but because of deterioration or ablation of the coating depending on time-period of using thereof, it is necessary to make a partial exchange of the upper electrode 20, periodically, as the countermeasure against the contamination and the particles mentioned above, and this brings about an increase of running cost and lowering of an operating rate of the apparatus.

For such problem explained by referring to FIG. 4, an explanation will be given on an operation of the plasma processing apparatus, according to the present embodiment, which was explained in the above by referring to FIGS. 1, 2 and 3, as well as, an effect(s) obtainable therefrom. As is apparent from FIG. 2, the first groove 7 is formed in the first plane-like member 4 on the side facing to the upper electrode 3, and into this groove is supplied the gas from the gas supply portion 6, which is formed on the upper electrode 3. The gas supplied into the first groove 7 flows into a direction of the plane of the first groove 7, and flows into the second groove 9 through the gas through hole 8, which is disposed at the position differing from that of the gas supply portion 6 on the plane. Following to the above, the gas flows into the direction of the plane of the second groove 9, and then is supplied into the electric discharge space 11 from the gas through hole 10, which is disposed at the position differing from that of the gas through hole 8 on the plane. From such flow of the gas as was mentioned above, the gas supply portion 6 formed on the upper electrode 3, the gas through hole 8 of the first plane-like member 4 and the gas through hole 10 of the second plane-like member 5 are connected, fluidly, through the first groove 7 and the second groove 9, having groove width sufficiently wide enough, with respect to the diameter of each through hole, therefore no such shift is generated in the through hole at a connecting portion of the gas supply, that comes up to be the problem, as in the conventional structure of the apparatus shown in FIG. 4. As a result of this, it is possible to maintain gas supply characteristics to be stable, and high in the reproducibility thereof. Also, because of the reason(s) mentioned above, it is possible to minimizing the diameter of the through hole of the gas supply portion 6, which is formed on the upper electrode 3, and further to suppress the abnormal electric discharge generating in the gas supply portion 6, which is formed on the upper electrode 3.

Figure 5:
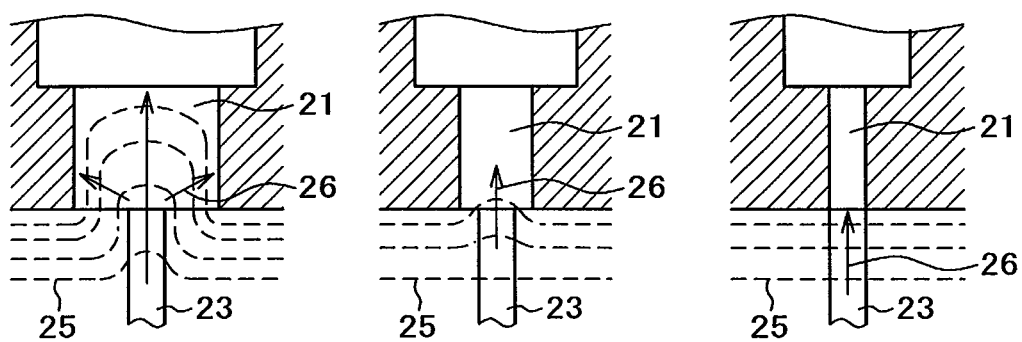
FIG. 5 is a cross-section view of the upper electrode for explaining an easiness of generating an abnormal electric discharge, depending on a diameter of a through hole, in the essential portion shown in FIG. 4, and in particular, showing that when the diameter of the through hole is large on the left-hand side, that when it is middle in a center, while showing that when it is small on the right-hand side, respectively.

Next, explanation will be given on a reason why the abnormal electric discharge is hardly generated, as the diameter of the through hole of the gas supply portion 6 comes to be small as possible, by referring to FIG. 5. This FIG. 5 shows the details of the gas supply portion 21 formed on the upper electrode 20 shown in FIG. 4, and also shows therein, a condition of equipotential surfaces caused due to the diameter of the gas supply portion 21. In case where the through hole diameter of the gas supply portion 21 is large, the equipotential surfaces 25, which is caused due to an electric field of the radio-frequency electric power applied to the upper electrode 20, invades into the through hole (i.e., the electric field enters into the through hole). As a result thereof, an electric field is generated within the through hole of the gas supply portion 21, and because of this electric field 26, the electric discharge can be generated, easily, within the gas supply portion 21. As is shown in FIG. 5, the equipotential surfaces 25 soaking into the gas supply portion 21 comes to be less, as the through hole diameter of the gas supply portion 21 comes to be small, and at the same time, the electric field 26 generating within the gas supply portion 21 is distinguished. With this, it is possible to reduce the risk of generating the abnormal electric discharge, by bringing the through hole diameter of the gas supply portion 21, as small, as possible.

Figure 6:
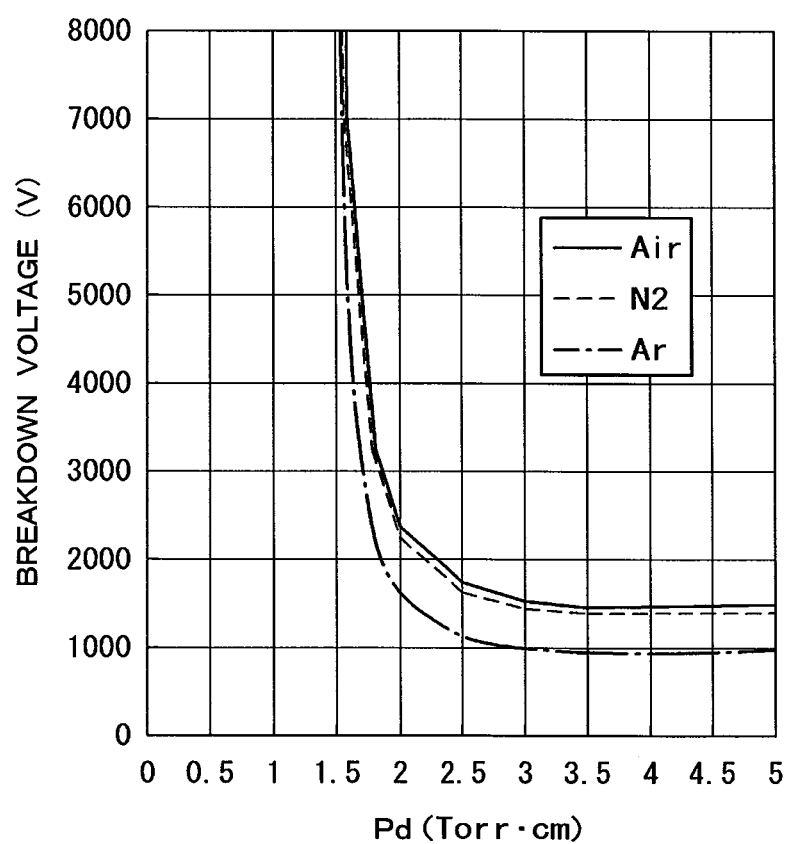
FIG. 6 is a view for showing a relationship between electric breakdown voltage and "pd" (a product of pressure of an ambient gas and distance between electrodes).

Also, an easiness of generation of the abnormal electric discharge in the gas supply portion 21 can be explained, from a Paschen's law shown in FIG. 6. The easiness of generation of the abnormal electric discharge depends on the product of the size of the space and gas pressure in that region. FIG. 6 shows electric breakdown voltages in various kinds of gases, with respect to the product (i.e., "pd") of the gas pressure "p" and the size "d" of the space, and shows that, the higher the electric discharge staring voltage, the harder the generation of the electric discharge. The abnormal electric discharge in the gas supply portion 6 is generated in the vicinity of a boundary surface between the upper electrode 3 and the first plane-like member 4. Normally, the gas pressure in the vicinity of the boundary surface between the upper electrode 3 and the first plane-like member 4 is 10 to 15 Torr. Therefore, from FIG. 6, in case where the gas pressure is 15 Torr, the electric breakdown voltage come to be high when the through hole diameter of the gas supply portion 6, i.e., the electric discharge space, is equal to or less than 1 mm; therefore, it is hard for the abnormal electric discharge to generate. The explanations given by referring to FIGS. 5 and 6 are only for showing a tendency thereof; however, the electric discharge space also affects an influence thereon, to some degree, not only the through hole diameter, but also the direction of depth of the through hole. Therefore, practically, it is possible to expand a margin for suppressing generation of the abnormal electric discharge, by forming the through hole to be smaller, further than the through hole diameter of 1 mm. In the present embodiment, actually, the through hole diameter of the gas supply portion 6 is determined to be 0.5 mm. With this, it is possible to achieve the structure, for suppressing the generation of the abnormal electric discharge, greatly, in the gas supply portion 6, and further for easing passage of the gas therethrough.

Further, in the plasma processing apparatus according to the present embodiment, which was explained by referring to FIGS. 2 and 3 in the above, the member, which can be seen from the electric discharge space 11, directly, through the gas through holes 10 of the second plane-like member 5, function as the shower plate, is the first plane-like member 4, and on active particle from the plasma 16 reaches on the upper electrode 3 (i.e., since the electrons and the particles exited are extinct or de-excited through collision on gas molecules or on the side wall(s) of the member(s) during processes of passing through the gas through holes of the second plane-like member 5, the second grooves 9 and the gas through holes 8 of the first plane-like member 4, they cannot reach onto the surface of the upper electrode 3). With this, it is possible to prevent the metal contaminations and/or the particles from being generated from a material of the upper electrode, which is made of a metal, i.e., the conductor, by forming the first plane-like member 4 and the second plane-like member 5 from a material, such as, quartz or the like. From a viewpoint of the metal contaminations, this is effective, in particular, when the plasma is corrosive.

Next, explanation will be given on the first groove 7 and the second groove 9 in FIGS. 1, 2 and 3. According to the present embodiment, the first groove 7 and the second groove 9 are formed on front and rear surfaces of the first plane-like member 4, and the groove width thereof is determined to 3 mm, while the groove height to 0.3 mm. The first groove 7 and the second groove 9 are formed, so that they connect the gas through holes, which are disposed on the same diameter of the concentric circles, as is shown in FIG. 3. With such structure as shown in FIG. 3, a pitch of the gas through holes disposed on the same concentric circles is determined to be 10 mm in the radial direction (i.e., the distance between the gas through holes in the radial direction). Therefore, the groove width of the first groove 7 and the second groove 9 is determined to be such one that separation can be obtained, fully, between the gas through holes, which are disposed on each diameter, i.e., 3 mm (i.e., a gas shielding width 7 mm between the diameters). Also, the groove height of the first groove 7 and the second groove 9 is determined to be 0.3 mm, for the purpose of suppressing the abnormal electric discharge within that grooves. The electric field generated due to the radio-frequency electric power to be used for generating the plasma acts on the upper electrode 3, the first groove 7 and the second groove 9, in the direction of thickness thereof. Therefore, in other words, that electric field acts in the direction of the groove height of the first groove 7 and the second groove 9, and then that groove height comes to be an important parameter for the purpose of preventing the abnormal electric discharge from being generated. FIG. 6 shows a dependency of the "pd" (i.e., the product of the distance in the direction of acting the electric field and the pressure) of the electric breakdown voltage based on the Paschen's law, to be used as a criterion of easiness of the electric discharge in the space. From FIG. 6, it can be confirmed that the electric breakdown voltage rises up abruptly when the "pd" (i.e., the product of the distance in the direction of acting the electric field and the pressure) on the horizontal axis is equal to or less than 1.5 Torr/cm. Rising up of the electric breakdown voltage means that it comes to hard for the electric discharge to generate. In the present embodiment, processing pressure in the electric discharge space lies in a range from $1 \times 10^{-3}$ Torr to 0.15 Torr, and an amount of gas flow is 2,000 sccm at the maximum. Under this condition of use, the pressure of the first groove 7 and the second groom reaches to nearly 15 Torr, at the maximum. Judging from the maximum pressure within the first groove 7 and the second groove 9 and FIG. 6, it can be the that, preferably, the groove height×pressure (i.e., the "pd") lies to be equal to or less than 1.5 Torr/cm. Therefore, it can be seen that the abnormal electric discharge is suppressed by determining the groove height of the first groove 7 and the second groove 9 to be equal to or lower than 1 mm. In the present embodiment, the groove height of the first groove 7 and the second groove 9 is determined to be 0.3 mm (i.e., equal to or less than 1.5 Torr/cm in the "pd"), for the purpose of increasing safety further. Since the groove width of the first groove 7 and the second groove 9 can be made relatively large (i.e., 3 mm in the present embodiment), it is possible to maintain gas conductance in the direction of plane even if the groove height has a sufficient margin to the abnormal electric discharge, such as, 3 mm, i.e., it is possible to supply the gas, uniformly, within each diameter shown in FIG. 3. Also, if the groove width is widen too much, then the respective contacting areas among the upper electrode 3, the first plane-like member 4 and the second plane-like member 5 come to be small. Normally, the upper electrode is controlled in the temperature thereof by the upper electrode temperature controlling means 24, and then, if the contacting areas are small, it is impossible to obtain thermal transfer, sufficiently, among the members, and in particular, the temperature control of the second plane-like member 5 contacting with the plasma comes to be difficult. Therefore, it is preferable the groove width has such width that the contacting area, being equal to or larger than 50%, can be kept between the elements, for each. Also, in such the structure shown in FIG. 3, though the first groove 7 and the second groove 9 are disposed, concentrically, but they may be disposed, in a radial manner, in a spiral manner or in a grid-like manner, as for as they can connect the respective gas through holes and function as gas passages. However, by taking the distribution of the electric field into the consideration, the concentric manner or the grid-like manner is referable.

In the structure of the present embodiment shown in FIGS. 1, 2 and 3, as the material of the first plane-like member 4 and the second plane-like member 5 is selected the quartz ($SiO_2$); however, it is needless to say that the similar effect can be obtained if applying yttrium oxide ($Y_2O_3$), aluminum oxide ($Al_2O_3$), silicon carbide (SiO) and silicon (Si) other than that. Also, in the structure shown in FIGS. 1, 2 and 3, the first plane-like member 4 and the second plane-like member 5 are made of the same material (i.e., the quartz); however, it is also needless to say that the similar effect can be obtained if combing the $SiO_2$, $Y_2O_3$, $Al_2O_3$, SiO, Si and the quartz mentioned above. In particular, since the second plane-like member is in contact with the plasma 16, it is preferable to make selection, with paying priority on tolerance or durability against the plasma. For example, by forming the second plane-like member from $Y_2O_3$, while the first plane-like member from $Y_2O_3$ or the material other than that, it is possible to achieve the apparatus having the effect(s) of the present embodiment, and less in exhaustion due to the plasma. Also, the upper electrode 3 to be disposed at the position facing to the sample 2 to be processed has a function as an opposing earth for the radio-frequency voltage, for generation of the plasma and applied onto the sample 2 to be processed. Upon the effect of the opposing earth for the radio-frequency voltage, for generating the plasma and applied onto the sample 2 to be processed, affects the conductivity and the dielectric constant of the first plane-like member 4 and the second plane-like member 5. From those viewpoints, as well as, the viewpoint of the durability against the plasma, there may be cases where the consideration must be paid on the combination of the materials of the first plane-like member 4 and the second plane-like member 5. For example, in case where both the first plane-like member 4 and the second plane-like member 5 shown in the embodiment are made of the quartz ($SiO_2$), from a viewpoint of plasma generation, the low dielectric constant (i.e., a relative dielectric constant of the quartz is about 4) is advantageous for the purpose of leveling or averaging the plasma, but from a viewpoint of the opposing earth, the low dielectric constant is disadvantageous because it increases an impedance. Then, by forming the first plane-like member 4 from the quartz and the second plane-like member 5 from $Y_2O_3$, having high dielectric constant (i.e., the relative dielectric constant of the quartz is about 11, being 2.75 times high comparing to that of the quartz), and thereby enabling to lower the impedance as the opposing earth, it is possible to increase the durability against the plasma, as well as, increasing the function as the opposing earth, for such structure as described as the embodiment.

In the present embodiment, the radio-frequency electric power of 200 MHz is applied or generating the plasma, and the radio-frequency electric power of 4 MHz is applied onto the sample 2 to be processed; however, it is needless to say that the similar effect can be obtained if the plasma generation and biasing of the sample to be process are implemented by other frequencies. Also, in the similar manner, it is needless to say that the similar effect can be obtained in case where no magnetic field is generated by the solenoid coil 15.

Also, in the present embodiment, the number of the gas through holes 8 of the first plane-like member 4 and the number of the gas supply portions 6 implemented on the upper electrode 3 are determined to be a half (½), comparing to the number of the gas through holes of the second plane-like member 5; however it is needless to say that the similar effect can be obtained if forming them by a number equal to that or further lessened than that, as far as, they are disposed so that the positions thereof are not in coincident with on the plane.

Also, in the present embodiment, the diameter of the gas through hole 8 of the first plane-like member 4 and the gas through hole 10 of the second plane-like member 5 is determined from 0.4 mm to 0.5 mm; however, it is needless to say that the similar effect can be obtained if determining the diameter of the gas through hole in a range from 0.1 mm to 1 mm.

Also, in the present embodiment, the upper electrode 3 is made of the metal, such as, aluminum or stainless, etc.; however, it is possible to achieve further reduction of the contaminations and/or the particles, with application of coating of either one of silicon dioxide ($SiO_2$), aluminum oxide ($Al_2O_3$), yttrium oxide ($Y_2O_3$) and polyimide, in particular, on the surface and part(s) thereof, on which the gas is in contact with.

When conducting the etching on a semiconductor and/or a insulator film formed on a silicon wafer, with applying a plasma etching apparatus having such structures as shown in FIG. 1 to FIG. 3, the uniformity and the reproducibility of gas are improved, the electric discharge condition is eased, and wafer contamination and/or attaching particles are reduced.

As was mentioned above, according to the present embodiment, it is possible to provide the plasma processing apparatus having a processing capacity superior in the uniformity and the reproducibility, and a stable plasma generation under the wide-ranging process conditions, even with the plasma processing apparatus of the parallel plate type.

The present invention should not be limited to the embodiments mentioned in the above, but it may include various variations thereof. For example, the embodiments mentioned above are explained in the details thereof, for the purpose of explaining the present invention, in a easily understandable manner; but the present invention should not always be limited to that having all of the constituent elements thereof, which are explained. Or, a part(s) of a certain constituent element(s) may be added/deleted/replaced by other constituent element(s).

The present invention relates to the plasma etching apparatus for conducting the etching process of a semiconductor material, with using a pattern, which is drawn through a lithography technology, in particular, as a mask. According to the present invention, it is possible to supply the gas from the plane-like gas supply means portion, which is disposed at the position of facing to the sample to be processed, uniformly and with high reproducibility and stability. Further, since the margin for suppressing the abnormal electric discharge and/or the contaminations in that plane-like gas supply means portion can be enlarged, greatly, it is possible to relax the restrictions, greatly, of the electric discharge condition, to be implemented, normally, for preventing those. As a result of the above, it is possible to achieve the plasma processing apparatus for enabling to increase the uniformity of processing rate and the uniformity of the etching profile, and/or the reproducibility thereof.

What is claimed is:

1. A plasma processing apparatus, comprising:
   a processing chamber in which a sample is configured to be plasma processed;
   a first electrode supplied with radio-frequency electric power to generate plasma and that includes a gas supply portion to supply a gas to generate the plasma, the gas supply portion disposing a plurality of first gas through holes;
   a first gas supply plate which is configured to supply the gas into the processing chamber, which disposes a plurality of second gas through holes and which is disposed under the first electrode;
   a second electrode disposed facing the first electrode, the first gas supply plate being disposed between the second electrode and the first electrode; and
   a second gas supply plate which is disposed under the first gas supply plate which disposes a plurality of third gas through holes,
   a first annular groove flow passage, in which the gas supplied from the first gas through holes flows, formed in the gas supply portion or the first gas supply plate,
   a second annular groove flow passage, in which the gas supplied from the second gas through holes flows, formed in the first gas supply plate or the second gas supply plate,
   wherein the first gas through holes penetrate the gas supply portion such that the first gas through holes connect to the first annular groove flow passage,
   wherein the second gas through holes penetrate the first gas supply plate such that the second gas through holes connect to the first annular groove flow passage at one end and connect to the second annular groove flow passage at another end thereof, and the second gas through holes do not coincide with the first gas through holes,
   wherein the third gas through holes penetrate the second gas supply plate such that the third gas through holes connect to the second annular groove flow passage and supply the gas flowed through the second gas through holes to the processing chamber, and the third gas through holes do not coincide with the second gas through holes,
   wherein, in a bottom view of the second gas supply plate, a projection of each of the first gas through holes and a projection of the second gas through holes are not coincident with each other and are located next to one another such that the projection of each of respective ones of the second gas through holes are disposed on one side of the projection of each of the first gas through holes in the bottom view of the of the second gas supply plate,
   wherein, in the bottom view of the second gas supply plate, each of the third gas through holes are not coincident with and are disposed on another side of the projection of each of the first gas through holes,
   wherein the gas supply portion disposes no gas through holes having projections that coincide with projections of any gas through holes of the first gas supply plate,
   wherein the first gas supply plate disposes no gas through holes having projections that coincide with any gas through holes of the second gas supply plate,
   wherein the gas supply portion disposes no gas through holes having projections that coincide with any gas through holes of the second gas supply plate,
   wherein the first electrode, the first gas through holes, the first gas supply plate, the second gas through holes, the second gas supply plate, the third gas through holes, the first annular groove flow passage and the second annular groove flow passage form a gas supply path, and
   wherein the plasma processing apparatus includes a plurality of gas supply paths arranged concentrically.

2. The plasma processing apparatus according to claim 1, wherein a depth of each of the first annular groove flow passage and the second annular groove flow passage is such a depth that voltage generating within the first annular groove flow passage and the second annular groove flow passage is lower than an electric breakdown voltage.

3. The plasma processing apparatus according to claim 2, wherein the depth of each of the first annular groove flow passage and the second annular groove flow passage is equal to or less than 1 mm.

4. The plasma processing apparatus according to claim 2, wherein a width of each of the first annular groove flow passage and the second annular groove flow passage is greater than a diameter of each of the first gas through hole, the second gas through hole, and the third gas through hole.

5. The plasma processing apparatus according to claim 4, wherein the first annular groove flow passage and the second annular groove flow passage are formed on the first gas supply plate.

6. The plasma processing apparatus according to claim 5, wherein the second annular groove flow passage is formed concentrically, including at least a center and an outer periphery thereof.

7. The plasma processing apparatus according to claim 6, wherein each of the first gas supply plate and the second gas supply plate is made of silicon dioxide.

8. The plasma processing apparatus according to claim 7, wherein the first electrode is a conductive body, and an electrode surface of the first electrode and a surface of the first electrode, opposing to the first gas supply plate, are coated by any one of silicon dioxide, yttrium oxide, polyimide, and aluminum oxide.

9. The plasma processing apparatus according to claim 7, wherein a number of each of the first gas through holes and the second gas through holes is less than a number of the third gas through holes.

10. The plasma processing apparatus according to claim 9, wherein the number of the first gas through holes is half of the number of the third gas through holes and the number of the second gas through holes is half of the number of the third gas through holes.

11. The plasma processing apparatus according to the claim 10, wherein,
    the gas supply portion is in contact with the first gas supply plate,
    the first gas supply plate is in contact with the second gas supply plate,
    cross sectional shapes of each of the first groove annular groove flow passage and the second annular groove flow passage are trench shape, a width of the first annular groove flow passage is formed so that a ratio of a contact area of the gas supply portion and the first gas supply plate to an area of the gas supply portion is over 50%, a width of the second annular groove flow passage is formed so that a ratio of a contact area of the first gas supply plate and the second gas supply plate to an area of the first gas supply plate is over 50%, a depth of the first annular groove flow passage is a depth in which a multiplication of a pressure of the gas in the first annular groove flow passage and the depth of the first annular groove flow passage is less than 1.5 Torr×cm, and a depth of the second annular groove flow passage is a depth in which a multiplication of a pressure of the gas in the second annular groove flow passage and the depth of the second annular groove flow passage is less than 1.5 Torr×cm, and each of a diameter of the first gas through hole, the second gas through hole, and the third gas through hole is in a range between 0.1 mm and 1.0 mm.

12. A plasma processing apparatus, comprising:

a processing chamber to plasma process a sample therein;

a first electrode supplied with radio-frequency electric power to generate the plasma and that includes a gas supply portion to supply a gas to generate the plasma, the gas supply portion disposing a plurality of first gas through holes;

a first gas supply plate which is configured to supply the gas into the processing chamber, which disposes a plurality of second gas through holes and which is disposed under the first electrode;

a second electrode which is disposed facing the first electrode, the first gas supply plate being disposed between the second electrode and the first electrode; and a second gas supply plate in which a plurality of third gas through holes are disposed and which is disposed under the first gas supply plate, a first annular groove flow passage, in which the gas supplied from the first gas through holes flows, formed on the gas supply portion or the first gas supply plate, a second annular groove flow passage, in which the gas supplied from the second gas through holes flows, formed on the first gas supply plate or the second gas supply plate, wherein the first gas through holes penetrate the gas supply portion and are connected to the first annular groove flow passage, wherein the second gas through holes penetrate the first gas supply plate and are connected to both of the first annular groove flow passage and the second annular groove flow passage, and each of the second gas through holes do not coincide with each of the first gas through holes, wherein the third gas through holes penetrate the second gas supply plate and are connected to the second annular groove flow passage and supply the gas supplied from the first gas supply plate to the processing chamber, and each of the third gas through holes do not coincide with each of the second gas through holes, wherein, in a bottom view of the second gas supply plate, a projection of each of the first gas through holes and a projection of each of the second gas through holes are not coincident with each other and are located next to one another such that the projection of respective ones of the second gas through holes are disposed on one side of the projection of each of the first gas through holes in the bottom view of the of the second gas supply plate, wherein, in the bottom view of the second gas supply plate, each of the third gas through holes are not coincident with and are disposed on another side of the axially extending projection of each of the first gas through holes, wherein the gas supply portion is formed with no gas through holes having projections that coincide with projections of any gas through holes of the first gas supply plate, wherein the first gas supply plate is formed with no gas through holes having projections that coincide with any gas through holes of the second gas supply plate, wherein the gas supply portion is formed with no gas through holes having projections that coincide with any gas through holes of the second gas supply plate, wherein the first electrode, the first gas through, holes, the first gas supply plate, the second, gas through holes, the second gas supply plate, the third gas through holes, the first annular groove flow passage, and the second annular groove flow passage form a gas supply path, and wherein the plasma processing apparatus includes a plurality of gas supply paths arranged concentrically.

13. The plasma processing apparatus according to claim 12, wherein a width of each of the first annular groove flow passage and the second annular groove flow passage is greater than a diameter of each of the first gas through hole, the second gas through hole and the third gas through hole.

14. The plasma processing apparatus according to claim 13, wherein the first annular groove flow passage and the second annular groove flow passage are formed on the first gas supply plate.

15. The plasma processing apparatus according to claim 14, wherein a dielectric constant of the first gas supply plate is less than a dielectric constant of the second gas supply plate.

16. The plasma processing apparatus according to claim 15, wherein the first gas supply plate is made of quartz and the second gas supply plate is made of yttrium oxide.

17. A plasma processing apparatus, comprising:

a processing chamber in which a sample is plasma processed;

a first electrode supplied with radio-frequency electric power to generate plasma and that includes a gas supply portion to supply a gas to generate the plasma;

a second electrode disposed facing the first electrode and on which the sample is disposed;

a first gas supply plate, which is supplied with gas from a plurality of first gas through holes penetrating the gas supply portion and is disposed under the first electrode; and a second gas supply plate, which is supplied with gas from a plurality of second gas through holes penetrating the first gas supply plate and is disposed under the first electrode;

wherein, the second gas supply plate is formed with a plurality of third gas through holes penetrating through the second gas supply plate, and supplies gas, which is supplied from the second gas through holes, inside the processing chamber through the third gas through holes, each of the first gas through holes and the second gas through holes are connected to one of a first annular gas groove flow passages including plural like annular gas groove flow passages each having a different radial dimension, each of the second gas through holes and each of the third gas through holes are connected to one of a second annular gas groove flow passages including plural like annular gas groove flow passages each having a different radial dimension, the first annular gas groove flow passage is formed on the gas supply portion or the first gas supply plate, the second annular gas groove flow passage is formed on the second gas supply plate or the first gas supply plate which are disposed above the second electrode, the first annular gas groove flow passage and the second annular gas groove flow passage are overlapping with each other in plane view, in the plane view, each of the first gas through hole is formed next to one side of the third gas through hole, in the plane view, each of the second gas through hole is formed next to the other side of the third gas through hole, the first annular gas groove flow passage and the second annular gas groove flow passage are formed on the first gas supply plate, the gas supply portion is in contact with the first gas supply plate, the first gas supply plate is in contact with the second gas supply plate, cross sectional shapes of each of the first annular gas groove flow passage and the second gas flow passage are trench shape, a width of the first annular gas groove flow passage is formed so that a ratio of a contact area of the gas supply portion and the first gas supply plate to an area of the gas supply portion is over 50%, a width of the second annular gas groove flow passage is formed so that a ratio of a contact area of the first gas supply plate and the second gas supply plate to an area of the first gas supply plate is over 50%, a depth of the first annular groove flow passage is a depth in which a multiplication of a pressure of the gas in the first annular gas groove flow passage and the depth of the first annular gas groove flow passage is less than 1.5 Torr×cm, and a depth of the second annular gas groove flow passage is a depth in which a multiplication of a pressure of the gas in the second annular pas groove flow passage and the depth of the second annular gas groove flow passage is less than 1.5 Torr×cm, and a diameter of each of the first gas through hole, the second gas through hole, and the third gas through hole, is in a range between 0.1 mm and 1.0 mm;

wherein, in a bottom view of the second gas supply plate, the gas supply portion is formed with no gas through holes having projections that coincide with projections of any gas through holes of the first gas supply plate, wherein, in the bottom view of the second gas supply plate, the first gas supply plate is formed with no gas through holes having projections that coincide with any gas through holes of the second gas supply plate, and wherein, in the bottom view of the second gas supply plate, the gas supply portion is formed with no gas through holes having projections that coincide with any gas through holes of the second gas supply plate wherein the first electrode, the first gas through holes, the first gas supply plate, the second gas through holes, the second gas supply, plate, the third gas through holes, the first annular gas groove flow passage, and the second annular gas groove flow passage form a gas supply path, and wherein the plasma processing apparatus includes a plurality of gas supply paths arranged concentrically.

* * * * *